(12) United States Patent
Sano et al.

(10) Patent No.: US 7,907,802 B2
(45) Date of Patent: Mar. 15, 2011

(54) OPTICAL TRANSMISSION MODULE

(75) Inventors: Akihiko Sano, Kyoto (JP); Junichi Tanaka, Kyoto (JP); Toshiaki Okuno, Kyoto (JP); Naru Yasuda, Kyoto (JP); Hayami Hosokawa, Kyoto (JP)

(73) Assignee: OMRON Corporation, Kyoto-shi, Kyoto (JP)

( * ) Notice: Subject to any disclaimer, the term of this patent is extended or adjusted under 35 U.S.C. 154(b) by 73 days.

(21) Appl. No.: 12/297,304

(22) PCT Filed: Apr. 26, 2007

(86) PCT No.: PCT/JP2007/059057
§ 371 (c)(1),
(2), (4) Date: Oct. 15, 2008

(87) PCT Pub. No.: WO2007/125995
PCT Pub. Date: Nov. 8, 2007

(65) Prior Publication Data
US 2009/0279827 A1  Nov. 12, 2009

(30) Foreign Application Priority Data

Apr. 27, 2006  (JP) .................................. 2006-124458

(51) Int. Cl.
*G02B 6/26* (2006.01)
*G02B 6/36* (2006.01)
(52) U.S. Cl. .......................................... 385/14; 385/88
(58) Field of Classification Search ............... 385/14, 385/15, 88, 93, 147
See application file for complete search history.

(56) References Cited

U.S. PATENT DOCUMENTS

| 7,068,889 | B2* | 6/2006 | Miyamae et al. | 385/49 |
| 7,254,301 | B2* | 8/2007 | Hoshino et al. | 385/52 |
| 7,590,315 | B2* | 9/2009 | Okubo et al. | 385/14 |
| 2003/0123814 | A1* | 7/2003 | Han et al. | 385/88 |
| 2003/0198443 | A1* | 10/2003 | Iwasaki | 385/88 |
| 2004/0008952 | A1* | 1/2004 | Kragl | 385/88 |
| 2004/0184743 | A1* | 9/2004 | Morioka | 385/93 |
| 2004/0234210 | A1* | 11/2004 | Nagasaka et al. | 385/88 |
| 2004/0264883 | A1* | 12/2004 | Althaus et al. | 385/88 |

(Continued)

FOREIGN PATENT DOCUMENTS

JP    6-82660  A    3/1994

(Continued)

OTHER PUBLICATIONS

International Search Report (English & Japanese) for PCT/JP2007/059057 mailed Jul. 24, 2007 (6 pages).

*Primary Examiner* — Akm E Ullah
(74) *Attorney, Agent, or Firm* — Osha Liang LLP

(57) ABSTRACT

An optical module has an optical element which transmits or receives an optical signal, an optical transmission line optically coupled to the optical element to transmit the optical signal, and a board to which at least one end portion including an incident and outgoing port of the optical signal in the optical transmission line and the optical element are fixed. A wall facing a side surface of the optical transmission line is provided in the board. A first space is provided between the board and the optical transmission line, and a second space is provided between the side surface of the optical transmission line and the wall. The first and second spaces are filled with a bonding agent.

17 Claims, 10 Drawing Sheets

U.S. PATENT DOCUMENTS

| | | | |
|---|---|---|---|
| 2005/0175292 A1* | 8/2005 | Supper | 385/88 |
| 2006/0067608 A1* | 3/2006 | Kobayashi et al. | 385/14 |
| 2006/0126994 A1* | 6/2006 | Higuchi et al. | 385/14 |
| 2006/0239605 A1* | 10/2006 | Palen et al. | 385/14 |
| 2007/0140628 A1* | 6/2007 | Ebbutt et al. | 385/89 |
| 2007/0297727 A1* | 12/2007 | Ueno et al. | 385/93 |

FOREIGN PATENT DOCUMENTS

| | | |
|---|---|---|
| JP | 2003-302544 A | 10/2003 |
| JP | 2004-21042 A | 1/2004 |
| JP | 2005-265885 | 9/2005 |
| JP | 2005-321588 | 11/2005 |

* cited by examiner

OPTICAL TRANSMISSION MODULE

TECHNICAL FIELD

The present invention relates to an optical transmission module, particularly to a package of the optical transmission module in which a highly-flexible optical transmission line is used.

BACKGROUND ART

Recently an optical communication network in which high-speed and large-capacity data communication can be conducted is increasingly expanded. It is expected that the optical communication network is expanded to a commercial-off-the-shelf device from now. An electric-input-and-output optical data transmission cable (optical cable) which can be used like a current electric cable is demanded for the purpose of high-speed and large-capacity data transfer, a countermeasure against noise, and data transmission between boards in a device. Preferably a film optical waveguide is used as the optical cable in consideration of flexibility.

The optical waveguide is formed by a core and a clad, and an optical signal incident to the core propagates through the optical waveguide while total reflection is repeatedly generated at a boundary between the core and the clad. The core has a large refractive index. The clad having a small refractive index is provided around the core while contacting the core. The film optical waveguide has the flexibility because the core and the clad are made of flexible polymer materials.

In the case where the flexible film optical waveguide is used as the optical cable, it is necessary that the film optical waveguide be aligned with a photoelectric conversion element (light emission and acceptance element) to establish optical coupling. The light emission and acceptance element converts an electric signal into the optical signal to supply the optical signal, and receives the optical signal to converts the optical signal into the electric signal. In the light emission and acceptance element, a light emitting element is used on a light input side, and a light acceptance element is used on a light output side. High accuracy is required in the alignment, because the alignment has an influence on optical coupling efficiency.

In the case where the optical waveguide is used as the optical cable, there is adopted a method in which an insertion hole is made in a package and the optical waveguide is directly inserted into the insertion hole to fixed the optical waveguide to the package. For example, Patent Document 1 discloses an example of the method.

Patent Documents 2 and 3 disclose a method for fixing an optical waveguide in the case where a highly-flexible optical waveguide is used as the optical cable. Specifically, the optical waveguide is directly fixed to the light emission and acceptance element with an adhesive member such as a bonding agent.

Further, FIGS. 15(a) and 15(b) show a configuration example of an optical transmission module in which the film optical waveguide and the light emission and acceptance element are optically coupled to each other. The configuration shown in FIGS. 15(a) and 15(b) differs from the examples disclosed in Patent Documents 1 to 3.

In an end portion on an light incident side or a light outgoing side, an optical module 200 shown in FIGS. 15(a) and 15(b) includes an optical waveguide 201, a light emission and acceptance element 202, and a package 203. In the neighborhood of the end portion of the optical waveguide 201, the optical waveguide 201 is rigidly bonded to the package 203 with a bonding layer 204. A relative positional relationship between the end portion of the optical waveguide 201 and the light emission and acceptance element 202 is in a fixed state. At this point, in the light emission and acceptance element 202, the light-emitting element such as a laser diode is used on the light incident side to the optical waveguide 201, and the light acceptance element such as a photodiode is used on the light outgoing side from the optical waveguide 201.

The package 203 has a step such that a surface on which the light emission and acceptance element 202 is mounted is different from a surface (bonding surface) to which the optical waveguide 201 is fixed. An end face of the optical waveguide 201 is not perpendicular to an optical axis (center axis along a lengthwise direction of the core portion), but the end face is obliquely cut out to form an optical path changing mirror. Therefore, the signal light propagating through the core portion of the optical waveguide 201 is reflected by the optical path changing mirror, a traveling direction of the signal light is changed, and the signal light is emitted toward the light emission and acceptance element 202.

Patent Document 1: Japanese Patent Publication Laid-Open No. 6-82660 (published date of Mar. 25, 1994)
Patent Document 2: Japanese Patent Publication Laid-Open No. 2003-302544 (published date of Oct. 24, 2003)
Patent Document 3: Japanese Patent Publication Laid-Open No. 2004-21042 (published date of Jan. 22, 2004)

However, in the conventional configuration shown in FIGS. 15(a) and 15(b), depending on a type of usage of the optical module 200, reliability is lowered in rigidly bonding the optical waveguide 201 to the package 203. The reason why the reliability is lowered will be described below.

As described above, the highly-flexible optical waveguide 201 has the high flexibility because the core and the clad are made of flexible polymer materials. It is expected that the flexibility is put to use the optical waveguide 201 in data transmission in a movable portion such as a hinge coupling portion of a mobile device.

However, in the optical waveguide 201 used in the movable portion, a deformation is naturally generated in association with the movement. For example, when the optical module 200 is mounted on the hinge coupling portion of the mobile device, a tensile force is generated in an optical axis direction of the optical waveguide 201 by stretching the hinge portion.

When the tensile force is generated in the optical axis direction of the optical waveguide 201, a large amount of deformation is generated in the highly-flexible optical waveguide 201 while the deformation is hardly generated in the highly-rigid package 203. Therefore, a risk of peel-off or a breakage of the optical waveguide is generated in a bonding surface between the optical waveguide 201 and the package 203.

One or more embodiments of the present invention provides a highly-reliable optical module in which highly-flexible optical waveguide is stably joined to the package.

DISCLOSURE OF THE INVENTION

An optical module according to one or more embodiments of the present invention includes an optical element which transmits or receives an optical signal; an optical transmission line which is optically coupled to the optical element to transmit the optical signal; and a board to which at least one end portion including an incident and outgoing port of the optical signal in the optical transmission line and the optical element are fixed, the optical module is characterized in that a space is provided between the board and the optical transmission liner the optical transmission line being movable in at least a direction perpendicular to an optical axis of the optical element in the space, and the space is filled with a bonding agent.

In the optical module, because the optical transmission line has high flexibility, a deformation is easily generated in the optical transmission line by a tensile force when the tensile force is generated in the optical axis direction of the optical transmission line. On the other hand, the board to which the optical transmission line is bonded has high rigidity, and the deformation is hardly generated in the board. Therefore, a large shearing force acts on an interface between the optical transmission line and the board.

According to the configuration, the space is provided between the board and the optical transmission line, and the space is filled with the bonding agent. Therefore, in the bonding agent, a difference in deformation amount between the optical transmission line and the board can be absorbed by the deformation of the bonding agent, so that the peel-off of the optical transmission line and the breakage of the optical transmission line are hardly generated, and the optical transmission line and the board are stably bonded to each other. Additionally, the optical element and the optical transmission line are directly aligned with and bonded to each other, so that an inexpensive component such as a molded component can be used to largely reduce the cost.

BRIEF DESCRIPTION OF THE DRAWINGS

FIG. 1(a) is a plan view showing a configuration of a main part of an optical module, and FIG. 1(b) is a sectional view showing a configuration of the main part of the optical module.

FIG. 5(a) is a plan view showing a configuration of a main part of an optical module, and FIG. 5(b) is a sectional view showing the configuration of the main part of the optical module.

FIG. 15(a) is a plan view showing a configuration of a main part of an optical module, and FIG. 15(b) is a sectional view showing the configuration of the main part of the optical module.

An embodiment of the present invention will be described below with reference to FIGS. 1 to 14. An example of a structure of an optical module according to an embodiment will be described with reference to FIGS. 1(a) and 1(b). FIG. 1(a) is a plan view showing a schematic configuration of an optical module 1, and FIG. 1(b) is a sectional view taken on line A-A of FIG. 1(a).

Figure 1:
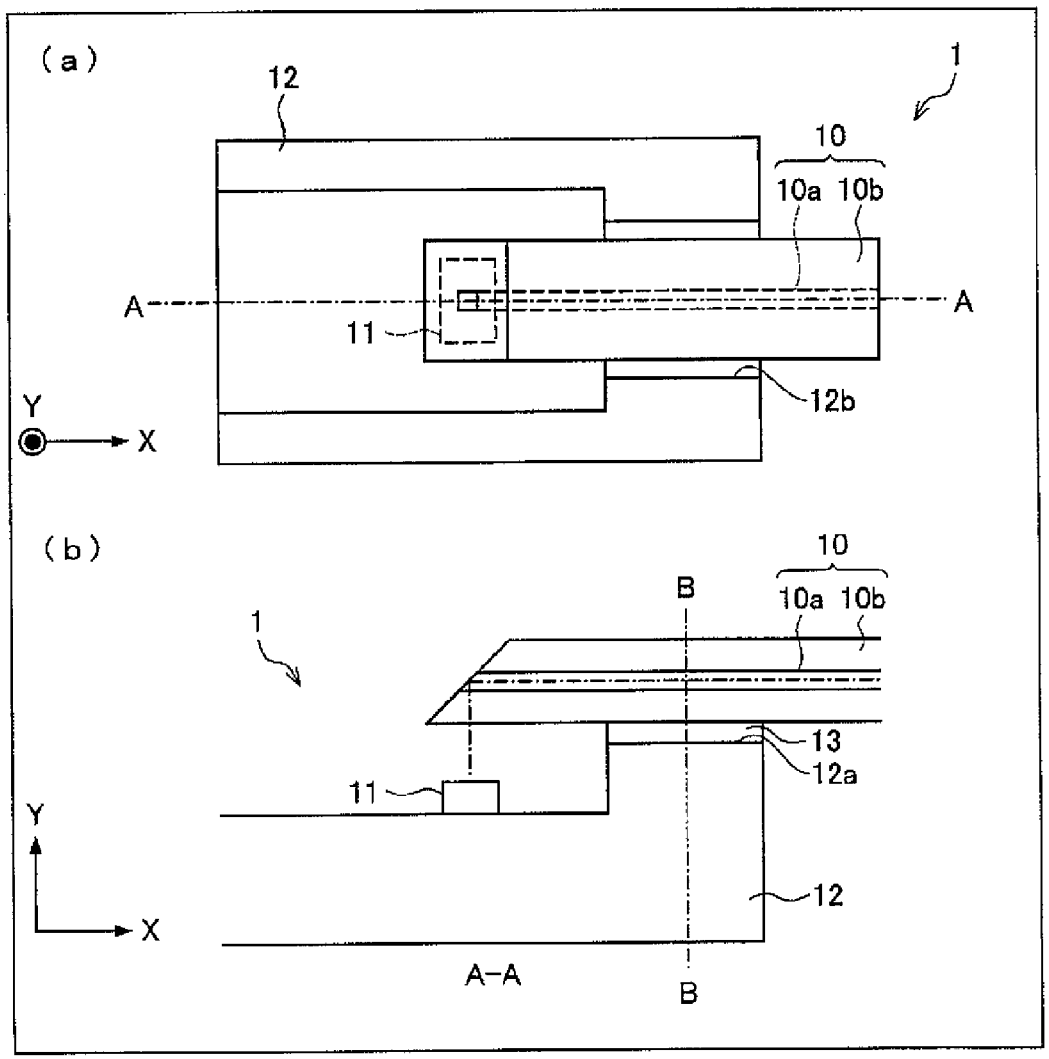
FIG. 1 shows an embodiment of the present invention.

The optical module 1, in the neighborhood thereof, mainly includes an optical waveguide (optical transmission line) 10, a light emission and acceptance element (optical element) 11, and a package (board) 12. Preferably the optical waveguide 10 is a polymer waveguide, and more preferably the optical waveguide 10 has the flexibility. An end portion of the optical waveguide 10 is rigidly bonded to the package 12 by a bonding agent 13, and a relative positional relationship between the end portion of the optical waveguide 10 and the light emission and acceptance element 11 is in a fixed state. Further, the optical module 1 may include electric wiring or an electric connection unit in order to easily take out an electric signal supplied from the light emission and acceptance element 11. In the light emission and acceptance element 11, the light-emitting element such as the laser diode is used on the light incident side to the optical waveguide 10, and the light acceptance element such as the photodiode is used on the light outgoing side from the optical waveguide 10.

The optical waveguide 10 includes a core portion 10a and a clad portion 10b. The core portion 10a is made of a material having a large refractive index. The clad portion 10b is provided around the core portion 10a while contacting the core portion 10a, and the clad portion 10b is made of a material having a small refractive index. In the optical waveguide 10, an optical signal incident to the core portion 10a propagates while total reflection is repeatedly generated at a boundary between the core portion 10a and the clad portion 10b. Because the core portion 10a and the clad portion 10b are made of polymer materials having flexibility, the optical waveguide 10 has the flexibility. In the following description, in the neighborhood of an end portion of the optical waveguide 10, it is assumed that a lengthwise direction (optical axis direction) of the optical waveguide 10 is set at an X-axis direction while a direction normal to a surface of the package 12 in which the light emission and acceptance element 11 is mounted is set at a Y-axis direction.

An end face of the optical waveguide 10 is not perpendicular to the optical axis (X-axis), but the end face is obliquely cut out to form an optical path changing mirror. Specifically, the end face of the optical waveguide 10 is perpendicular to an XY-plane, and the end face is inclines so as to form an angle $\theta$ ($\theta<90°$) with respect to the X-axis.

Therefore, on the light outgoing side of the optical waveguide 10, the signal light propagating through the core portion 10a is reflected by the optical path changing mirror, and the traveling direction of the signal light is changed, and the signal light is emitted toward the light acceptance element 11. On the light incident side of the optical waveguide 10, the signal emitted from the light-emitting element 11 is reflected by the optical path changing mirror, the traveling direction of the signal is changed, and the signal is transmitted to the core portion 10a.

In the production of the optical module 1, after the light emission and acceptance element 11 is mounted on the package 12, a space is provided between the light emission and acceptance element 11 and the optical waveguide 10 such that the light emission and acceptance element 11 and the end portion of the optical waveguide 10 are optically coupled, the space is filled with a bonding agent 13, and the bonding agent 13 is cured.

Figure 15:
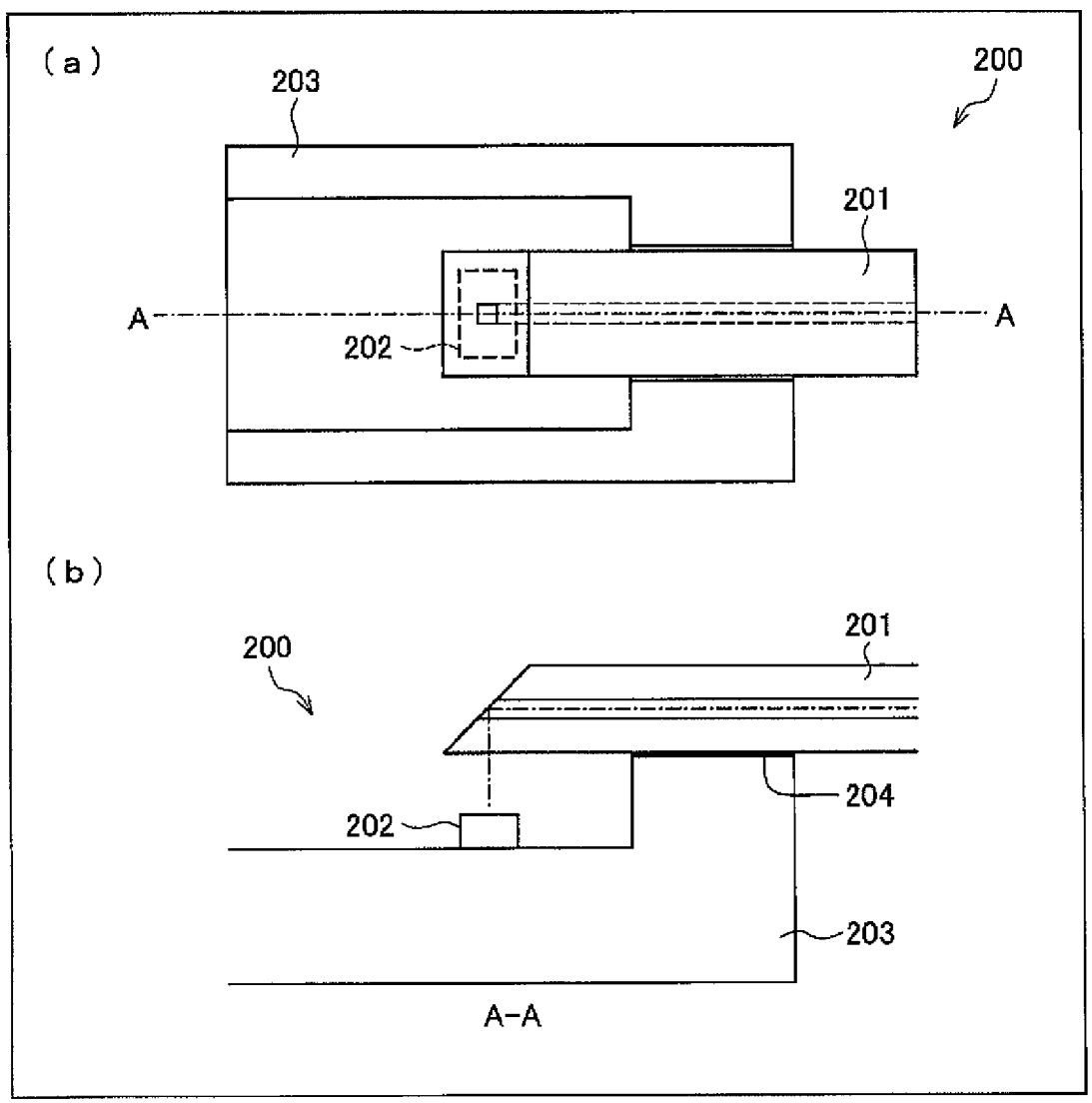
FIG. 15 shows a conventional optical module.

In the optical module 1, the optical waveguide 10 is mounted on a surface 12a of the package 12, and the optical waveguide 10 is rigidly bonded to the package 12 with the bonding agent 13. At this point, in the case of the conventional structure shown in FIG. 15(b), the optical waveguide 201 and the package 203 are bonded by the extremely thin bonding layer 204. This is because the lower surface (bonding surface) of the optical waveguide 201 is substantially aligned with the upper surface of the package 203 to position the optical waveguide 201 in the Y-axis direction.

On the other hand, in the optical module 1 of the embodiment, the bonding agent 13 is not limited to the function of rigidly bonding the optical waveguide 10 to the package 12. That is, the optical module 1 is characterized in that a space where the optical waveguide 10 can be moved at least a direction perpendicular to the optical axis thereof is provided between the package 12 and the optical waveguide 10 and the space is filled with the bonding agent 13. Thus, in the optical module 1, the large space is provided between the package 12 and the optical waveguide 10 compared with the conventional technique, and the space is filled with the bonding agent 13, so that the highly-flexible optical waveguide 10 can stably be bonded to the package 13. The reason why the highly-flexible optical waveguide 10 can stably be bonded to the package 13 will be described below.

In the optical module 1, because the optical waveguide 10 has the high flexibility, the deformation is easily generated in the optical waveguide 10 by the tensile force when the tensile force is generated in the optical axis (X-axis) direction of the optical waveguide 10. On the other hand, the package 12 to which the optical waveguide 10 is bonded has the high rigidity, and the deformation is hardly generated in the package 12, whereby the large shearing force acts on the bonding agent 13. At this point, in the case where the bonding layer has the small thickness like the conventional configuration, it cannot be expected that the deformation is generated in the bonding layer on which the shearing force acts. Therefore, the bonding layer cannot absorb the difference in deformation amount between the optical waveguide and the package, and peel-off or a breakage of the optical waveguide is easily generated. On the other hand, in the case where the space between the package 12 and the optical waveguide 10 is filled with the bonding agent 13, because the bonding agent 13 can absorb the difference in deformation amount between the optical waveguide 10 and the package 12 by the deformation of the bonding agent 13, the peel-off of the optical waveguide 10 is hardly generated, and the optical waveguide 10 and the package 12 are stably bonded.

In order that the bonding agent 13 absorbs the difference in deformation amount between the optical waveguide 10 and the package 12, it is necessary that the bonding agent 13 be a resin having an elastic modulus lower than that of the package 12, and preferably the bonding agent 13 has an elastic modulus which is equal to or lower than that of the optical waveguide 10 (particularly, clad layer). Therefore, preferably an epoxy resin, an acrylic resin, a urethane resin, a silicone resin, a butyl resin, or the like can be used as the bonding agent 13. Preferably the space between the package 12 and the optical waveguide 10 is not lower than 50 μm such that the bonding agent 13 has the layer thickness enough to be able to absorb the difference in deformation amount between the optical waveguide 10 and the package 12.

Usually one of an ultraviolet curing resin, a visible-light curing resin, and a thermoset resin is used as the bonding agent 13. Preferably one of the ultraviolet curing resin and the visible-light curing resin is used in order to enhance productivity. Further, the optical waveguide 10 is aligned with the package 12 while the optical waveguide 10 and the package 12 is tentatively bonded by pre-curing bonding agent 13, and the bonding agent 13 is cured after completion of the alignment.

In order to fit the optical waveguide 10, a groove 12b is provided in the mounting surface 12a of the package 12 in which the optical waveguide 10 is mounted. In the conventional technique, the groove has a width (having a slight clearance) which is substantially equal to a width of the optical waveguide, and the optical waveguide is fitted in the groove to perform the positioning in the width direction (direction orthogonal to the XY-plane) of the optical waveguide.

Figure 2:
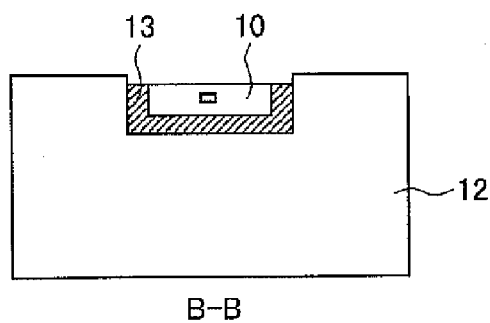
FIG. 2 is a sectional view taken on line B-B of FIG. 1(b).

On the other hand, in the optical module 1 of the embodiment, the space between the optical waveguide 10 and the package 12 is also provided in the width direction of the groove 12b, and the clearance between the optical waveguide 10 and the package 12 in the width direction (direction orthogonal to the XY-plane) is larger than the movable amount during the alignment. As shown in FIG. 2, because the clearance portion is also filled with the bonding agent 13, the stable bonding is obtained between the optical waveguide 10 and the package 12. FIG. 2 is a sectional view taken on line B-B of FIG. 1(b).

In the optical module 1, in the portion in which the optical waveguide 10 is fixed to the package 12, the optical waveguide 10 may have the structure in which the optical waveguide 10 can be retained against the stress in the optical axis (X-axis) direction of the optical waveguide 10.

Figure 3:
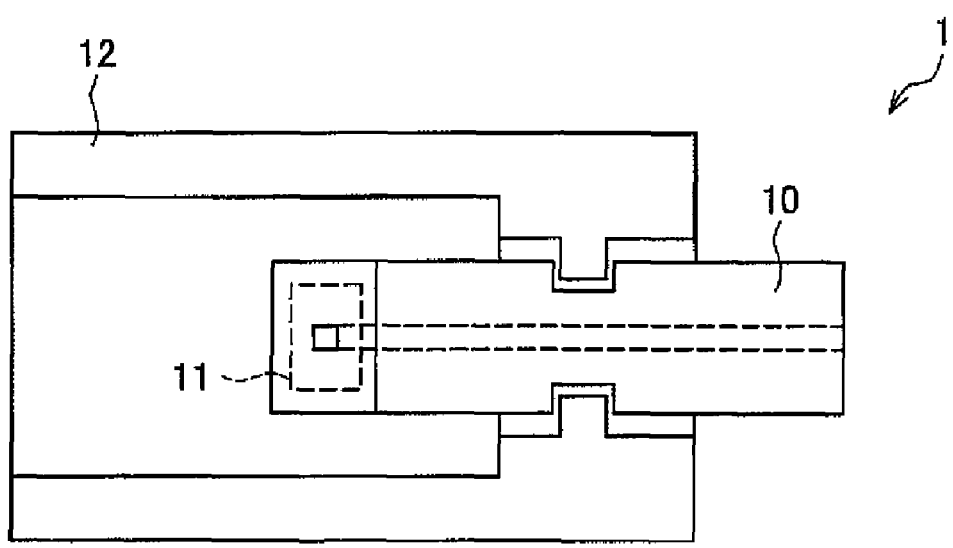
FIG. 3 shows an embodiment of the present invention, and is a plan view showing a configuration of a main part of an optical module.

For example, as shown in FIG. 3, a positioning portion such as a notch is provided in the optical waveguide 10, a projection is formed toward the optical waveguide 10 in the portion of the package 12 to which the optical waveguide 10 is fixed, and the notch portion may be engaged with the projection on the side of the package 12 to retain the optical waveguide 10 against the stress in the X-axis direction.

Figure 4:
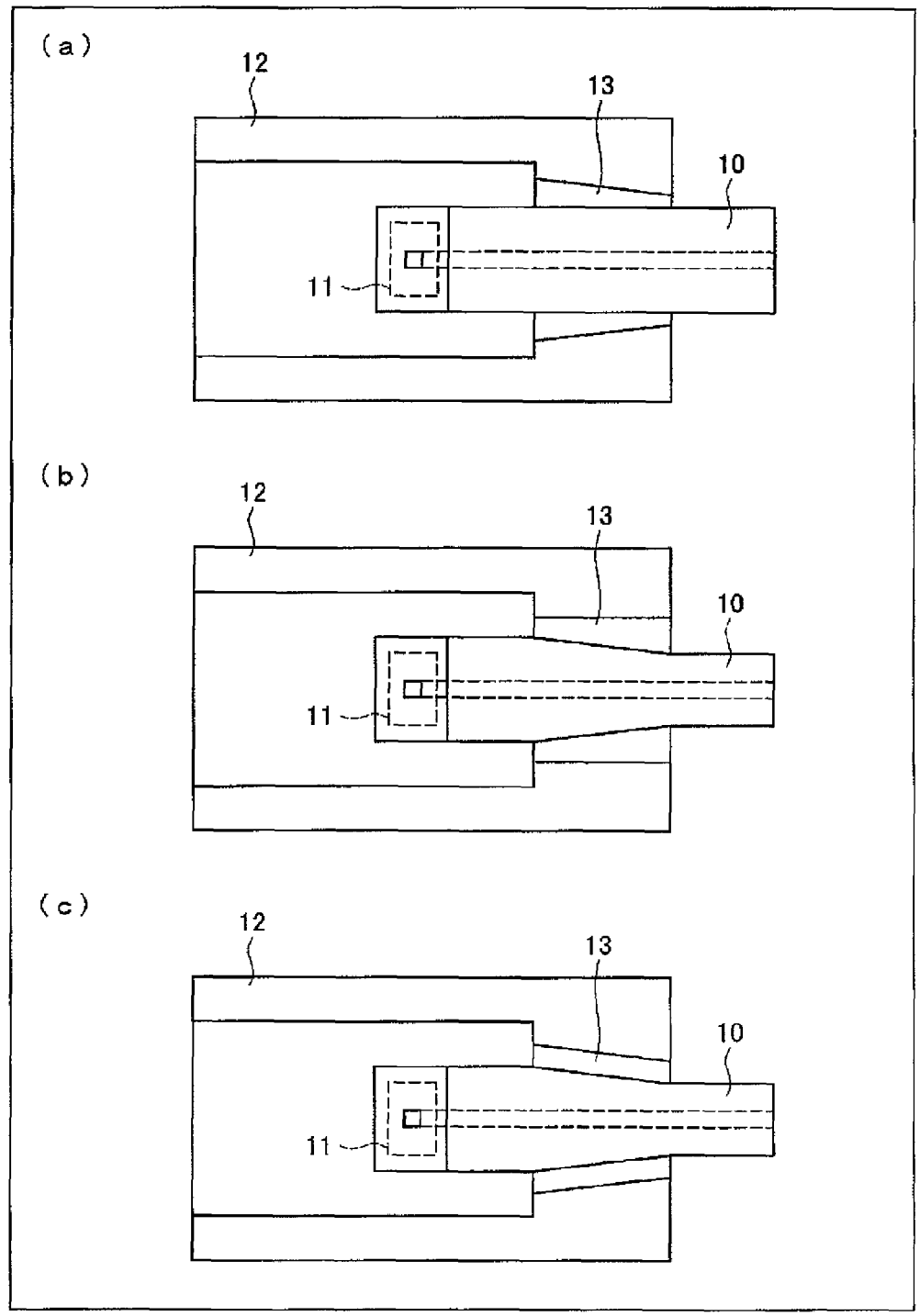
FIGS. 4(a) and 4(b) show an embodiment of the present invention, and are plan views showing a configuration of a main part of an optical module.

Alternatively, in the space portion filled with the bonding agent 13, the portion of the package 12 to which the optical waveguide 10 is fixed may be tapered toward the optical axis direction of the optical waveguide 10 (see FIG. 4(a)). Alternatively, in the space portion filled with the bonding agent 13, the portion of the optical waveguide 10 to which the package 12 is fixed may be tapered toward the optical axis direction of the optical waveguide 10 (see FIG. 4(b)). Further, both the package and the optical waveguide may be tapered and combined (see FIG. 4(c)).

In the optical module 1, the layer of the bonding agent 13 is thickened, and the elastic modulus of the bonding agent 13 is set lower than that of the package 12, thereby preventing the peel-off between the optical waveguide 10 and the package 12. However, the present invention is not limited to the embodiment, but various modifications can be made. Some modifications according to one or more embodiments to the present invention will be described below.

Figure 5:
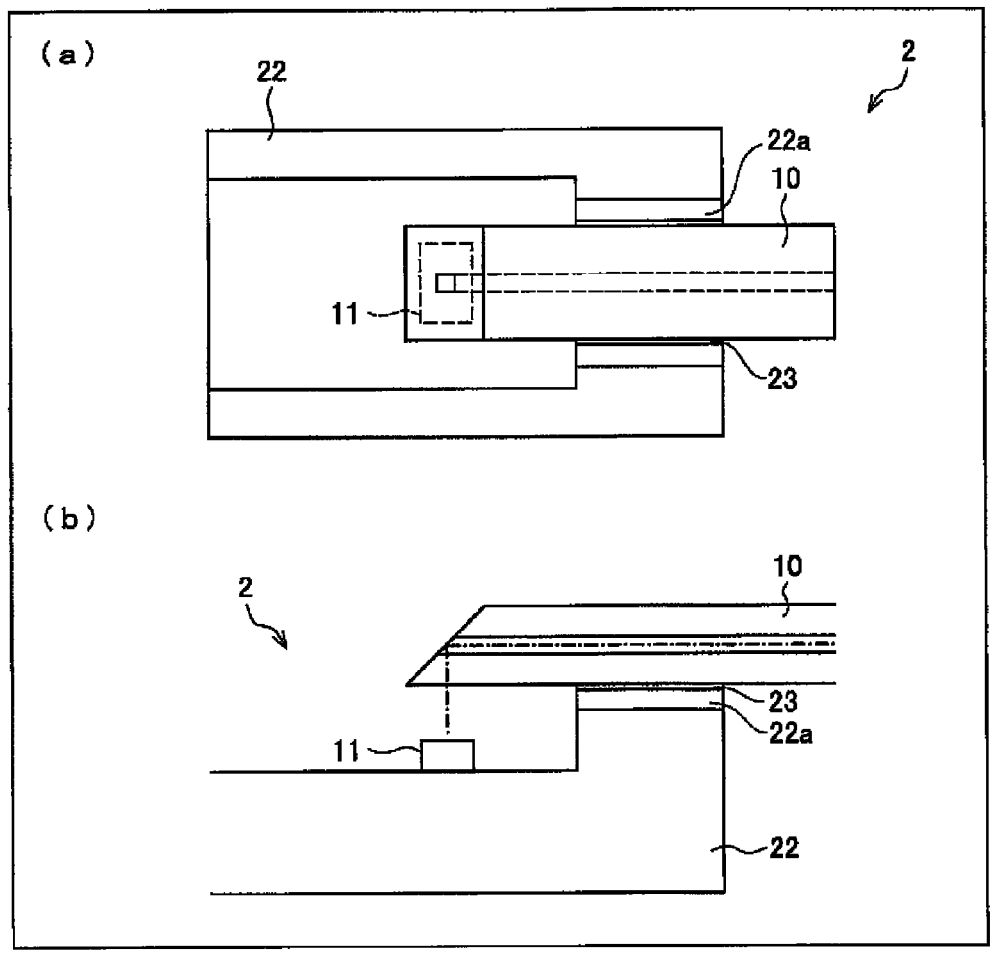
FIG. 5 shows an embodiment of the present invention.

An optical module 2 shown in FIGS. 5(*a*) and 5(*b*) includes the optical waveguide 10, the light emission and acceptance element 11, and a package 22. The optical waveguide 10 is rigidly bonded to the package 22 by a bonding agent 23. In the package 22 of the optical module 2, a contact portion 22*a* which contacts the optical waveguide 10 is made of a highly-flexible material. Preferably the elastic modulus of the contact portion 22*a* is equal to or lower than the elastic modulus of the package 12, more preferably the elastic modulus of the contact portion 22*a* is equal to or lower than the elastic modulus of the optical waveguide 10.

Accordingly, in the optical module 2 shown in FIGS. 5(*a*) and 5(*b*), when the tensile force is generated in the optical axis (X-axis) direction of the optical waveguide 10, the deformation is easily generated in the contact portion 22*a* of the package 22 according to the deformation generated in the optical waveguide 10. That is, the difference in deformation amount between the optical waveguide 10 and the package 22 is not generated, and the peel-off is hardly generated, thereby stably bonding the optical waveguide 10 and the package 22.

Figure 6:
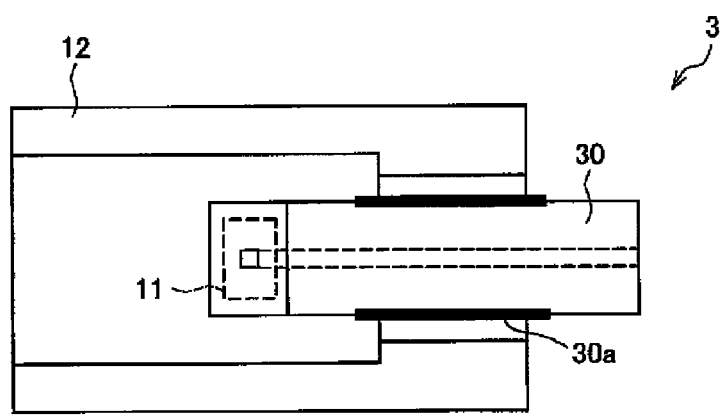
FIG. 6 shows an embodiment of the present invention, and is a plan view showing a configuration of a main part of an optical module.

An optical module 3 shown in FIG. 6 includes an optical waveguide 30, the light emission and acceptance element 11, and the package 12. The optical waveguide 30 is rigidly bonded to the package 12 with the bonding agent 13. In the module 3, the optical waveguide 30 is sandwiched between reinforcing materials 30*a* on both sides in the width direction (direction orthogonal to the XY-plane) of the optical waveguide 30. The reinforcing material 30*a* has a small stretching property. Therefore, even if the tensile force is generated in the optical axis (X-axis) direction of the optical waveguide 30, the deformation of the optical waveguide 10 is hardly generated, and the peel-off of the optical waveguide 10 is hardly generated, thereby stably bonding the optical waveguide 30 and the package 12.

It is only necessary to sandwich the optical waveguide 30 between the reinforcing materials 30*a* in at least a contact range between the optical waveguide 30 and the package 12. In the configuration of FIG. 6, the optical waveguide 30 is sandwiched between the reinforcing materials 30*a* on both the sides in the width direction of the optical waveguide 30. However, the present invention is not limited to the configuration of FIG. 6. For example, the optical waveguide 10 may have a structure in which the reinforcing material having the small stretching property is provided in at least one surface in the width direction of the optical waveguide 10.

Although not shown, performing an interface treatment, UV cleaning, a corona discharge, a plasma treatment, primer coating, or the like to the bonding portion between the optical waveguide and the package to increase the bonding strength is effective means for hardly generating the peel-off of the optical waveguide.

Figure 7:
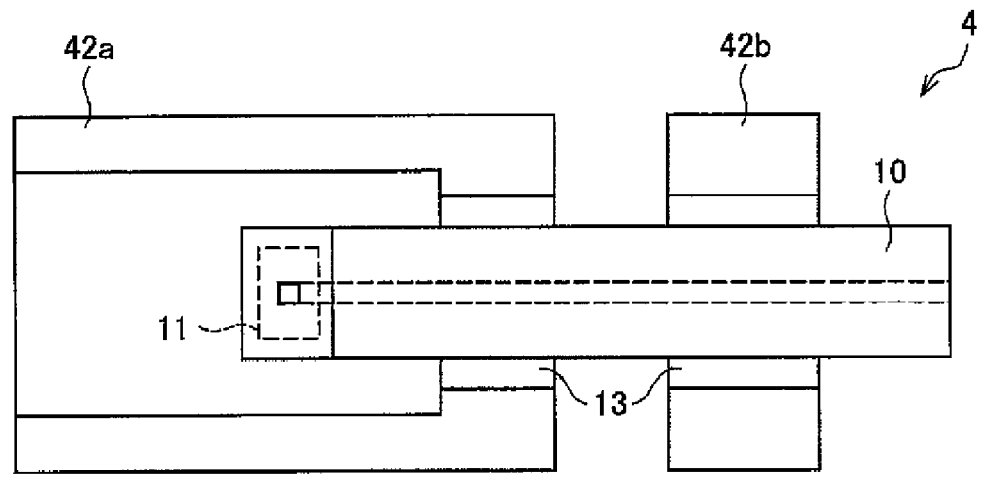
FIG. 7 shows an embodiment of the present invention, and is a plan view showing a configuration of a main part of an optical module.

An optical module 4 shown in FIG. 7 includes the optical waveguide 10, the light emission and acceptance element 11, and a package 42. The optical waveguide 10 is rigidly bonded to the package 42 with the bonding agent 13. In the optical module 4, the optical waveguide 10 is bonded to the package 42 in two bonding surfaces 42*a* and 42*b*. At this point the bonding surface 42*a* is one which is located closer to the bonding end portion to the light emission and acceptance element 11, and the bonding surface 42*b* is one which is located farther away from the bonding end portion to the light emission and acceptance element 11. Although the bonding surfaces 42*a* and 42*b* are formed in the same package 42 in FIG. 7, the bonding surface 42*b* may be provided in a region different from the optical module.

In such cases, even if the tensile force acts on the optical waveguide 10, the tensile force acts on only the side of the bonding surface 42*b* while tensile force hardly acts on the side of the bonding surface 42*a*. Therefore, even if the tensile force is generated in the optical axis (X-axis) direction of the optical waveguide 10, the peel-off of the optical waveguide 10 is hardly generated at least the side of the bonding surface 42*a*, and the optical waveguide 10 and the package 42 are stably bonded.

Figure 8:
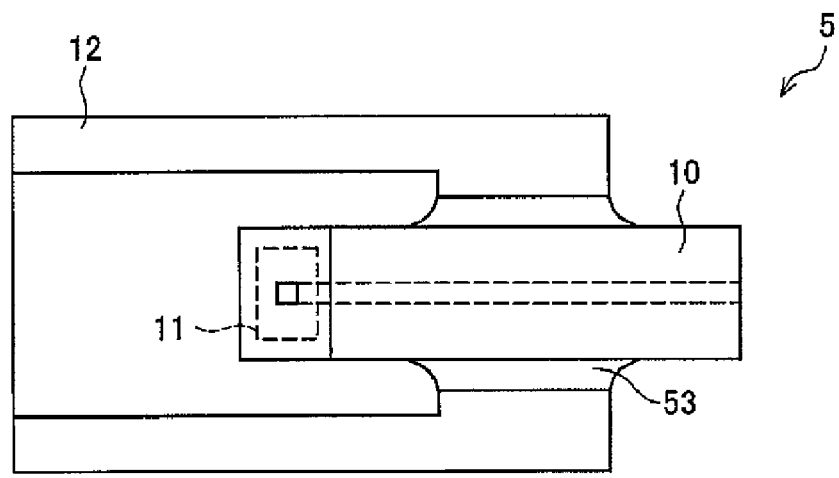
FIG. 8 shows an embodiment of the present invention, and is a plan view showing a configuration of a main part of an optical module.

An optical module 5 shown in FIG. 8 includes the optical waveguide 10, the light emission and acceptance element 11, and the package 12. The optical waveguide 10 is rigidly bonded to the package 12 with a bonding agent 53. In the bonding agent 53 of the optical module 5, a fillet is provided in a boundary portion between the package 12 and the optical waveguide 10. As used herein, the fillet shall mean a portion in which the pre-curing bonding agent applied rises at the interface with the optical waveguide 10 by a surface tension.

At this pint, in the case where the tensile force acts on the optical waveguide 10, it is thought that the peel-off of the optical waveguide 10 is generated by stress concentration on the side opposite to the bonding side between the optical waveguide 10 and the light emission and acceptance element 11. On the other hand, in the optical module 5 of FIG. 8, the fillet is formed to increase the bonding strength in the bonding agent 53 on the side opposite to the bonding side between the optical waveguide 10 and the light emission and acceptance element 11. The side opposite to the bonding side between the optical waveguide 10 and the light emission and acceptance element 11 becomes easily a start point of the peel-off of the optical waveguide 10. Therefore, the peel-off of the optical waveguide 10 is hardly generated, and the optical waveguide 10 and the package 22 are stably bonded to each other.

Figure 9:
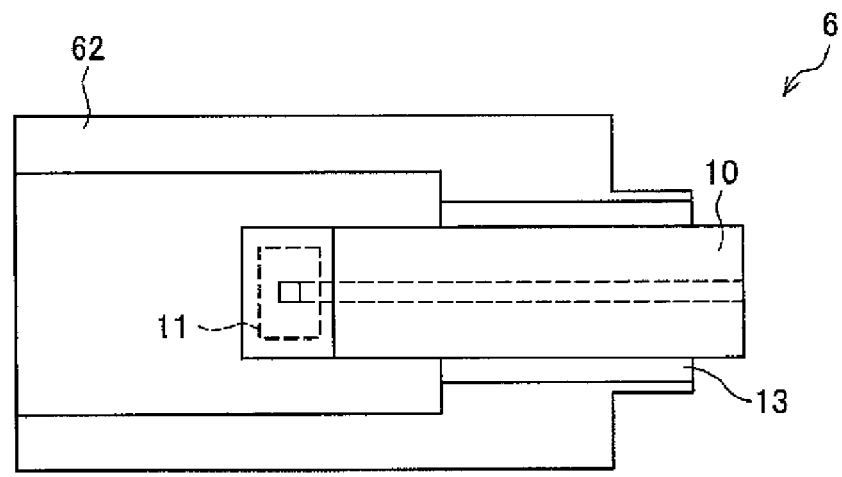
FIG. 9 shows an embodiment of the present invention, and is a plan view showing a configuration of a main part of an optical module.

An optical module 6 shown in FIG. 9 includes the optical waveguide 10, the light emission and acceptance element 11, and a package 62. The optical waveguide 10 is rigidly bonded to the package 62 with the bonding agent 13. In the package 62 of the optical module 6, on the side opposite to the bonding side between the optical waveguide 10 and the light emission and acceptance element 11, an edge of the package 62 is extended toward the outside of the optical axis of the optical waveguide 10 in the portion in which the interface between the package 62 and the bonding agent 13 is formed. With this configuration, because the contact area between the optical waveguide 10 and the bonding agent 13 can be enlarged to increase the bonding strength, the peel-off of the optical waveguide 10 is hardly generated, and the optical waveguide 10 and the package 62 are stably bonded to each other.

Figure 10:
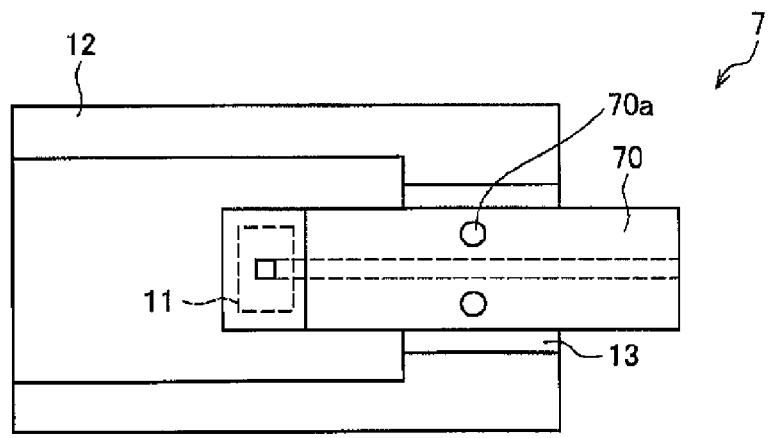
FIG. 10 shows an embodiment of the present invention, and is a plan view showing a configuration of a main part of an optical module.

An optical module 7 shown in FIG. 10 includes an optical waveguide 70, the light emission and acceptance element 11, and the package 12. The optical waveguide 70 is rigidly bonded to the package 12 with the bonding agent 13. In the optical waveguide 70 of the optical module 7, openings 70*a* are provided, and the openings 70*a* are also filled with the bonding agent 13. At this point, the openings 70*a* are formed not in the core portion, but only in the clad portion.

Thus, the openings 70*a* are formed in the optical waveguide 70, and the openings 70*a* are filled with the bonding agent 13. Therefore, even if the tensile force acts on the optical waveguide 70, because the bonding agent 13 with which the opening 70*a* is filled becomes a reaction against the tensile force, the peel-off of the optical waveguide 70 is hardly generated, and the optical waveguide 70 and the package 12 are stably bonded to each other.

Figure 11:
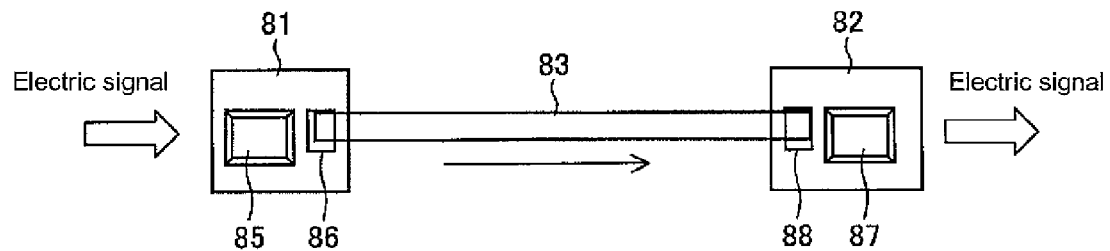
FIG. 11 is a view showing a schematic configuration of an optical transmission module according to an embodiment.

The above-described optical module includes a light acceptance element and a light-emitting element at both ends of the optical waveguide which is of the optical transmission line, which allows the optical module to act as the optical transmission module. FIG. 11 shows a schematic configuration of an optical transmission module according to an embodiment. As shown in FIG. 11, the optical transmission module includes a light-emitting and processing unit 81, a light acceptance and processing unit 82, and an optical waveguide 83.

The light-emitting and processing unit 81 includes a light emission drive unit 85 and a light-emitting unit 86. The light emission drive unit 85 drives the light emission of the light-emitting unit 86 based on the electric signal supplied from the outside. For example, the light emission drive unit 85 is formed by a light emission driving IC (Integrated Circuit). Although not shown, an electric connection portion with electric wiring through which the electric signal is transmitted from the outside is provided in the light emission drive unit 85.

The light-emitting unit 86 emits the light based on drive control of the light emission drive unit 85. For example, the light-emitting unit 86 is formed by a light-emitting element such as a VCSEL (Vertical Cavity-Surface Emitting Laser). The end portion on the light incident side of the optical waveguide 83 is irradiated with the light, which is of the optical signal, emitted from the light-emitting unit 86.

The light acceptance and processing unit 82 includes an amplifying unit 87 and a light acceptance unit 88. The light acceptance unit 88 accepts the light which is of the optical signal emitted from the end portion on the light outgoing side of the optical waveguide 83, and supplies the electric signal through the photoelectric conversion. For example, the light acceptance unit 88 is formed by a light acceptance element such as a PD (Photo-Diode).

The amplifying unit 87 amplifies the electric signal supplied from the light acceptance unit 88 and supplies the amplified electric signal to the outside. For example, the amplifying unit 87 is formed by an amplifying IC. Although not shown, an electric connection portion with electric wiring through which the electric signal is transmitted from the outside is provided in the amplifying unit 87.

As described above, the optical waveguide 83 is a medium through which the light emitted from the light acceptance unit 86 is transmitted to the light acceptance unit 88.

The optical transmission module according to one or more embodiments of the present invention can be applied to various electronic devices as follows. In the following applications, only the optical waveguide 10 in the optical transmission module according to one or more embodiments of the present invention is shown, and other components are not shown.

For a first application example, the optical transmission module can be used as a hinge portion in foldable electronic devices such as a foldable portable telephone, a foldable PHS (Personal Handyphone System), a foldable PDA (Personal Digital Assistant), and a foldable notebook personal computer.

Figure 12:
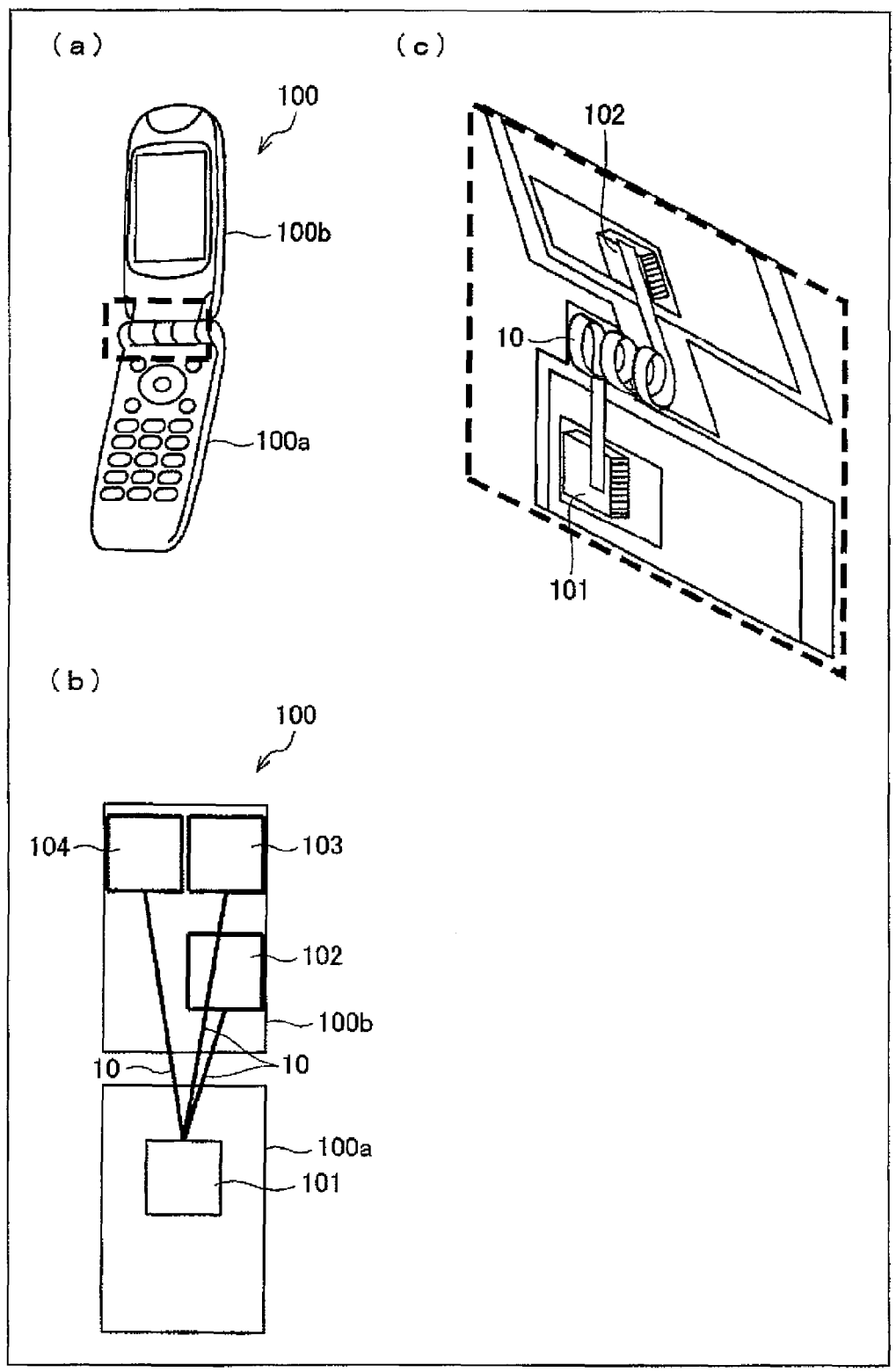
FIG. 12(a) is a perspective view showing an appearance of a foldable portable telephone provided with the optical transmission module according to the embodiment.
FIG. 12(b) is a block diagram showing a portion to which an optical transmission line is applied in the foldable portable telephone shown in FIG. 12(a)
FIG. 12(c) is a perspective plan view showing a hinge portion in the foldable portable telephone shown in FIG. 12(a).

FIGS. 12(a) to 12(c) show an example in which the optical transmission module including the optical waveguide 10 is applied to a foldable portable telephone 100. That is, FIG. 12(a) is a perspective view showing an appearance of the foldable portable telephone 100 in which the optical waveguide 10 is incorporated.

FIG. 12(b) is a block diagram showing a portion to which the optical waveguide 10 is applied in the foldable portable telephone 100 shown in FIG. 12(a). As shown in FIG. 12(b), a control unit 101, an external memory 102, a camera unit (digital camera) 103, and a display unit (liquid crystal display) 104 are connected by the optical waveguide 10, respectively. The control unit 101 is provided on a side of a main body 100a in a foldable portable telephone 100. The external memory 102 is provided on a side of a cover (drive unit) 100b, and the cover 100b is included at one end of the main body while being rotatable about the hinge portion.

FIG. 12(c) is a perspective plan view showing a hinge portion (surrounded by a broken line) of FIG. 12(a). As shown in FIG. 12(c), the optical waveguide 10 is bent while wrapped around a support rod in the hinge portion, thereby connecting the control unit provided on the main body side, the external memory 102 provided on the cover side, the camera unit 103, and the display unit 104, respectively.

The high-speed and large-capacity communication can be realized in a limited space by applying the optical waveguide 10 to the foldable electronic device. Accordingly, the optical transmission module is particularly suitable to the device such as the foldable liquid crystal display in which the high-speed and large-capacity data communication and the compact size are demanded.

For a second application example, the optical transmission module including the optical waveguide 10 can be applied to an apparatus provided with a drive unit, such as a printhead of a printer (electronic device) and a reading unit of a hard disk recording and reproducing apparatus.

Figure 13:
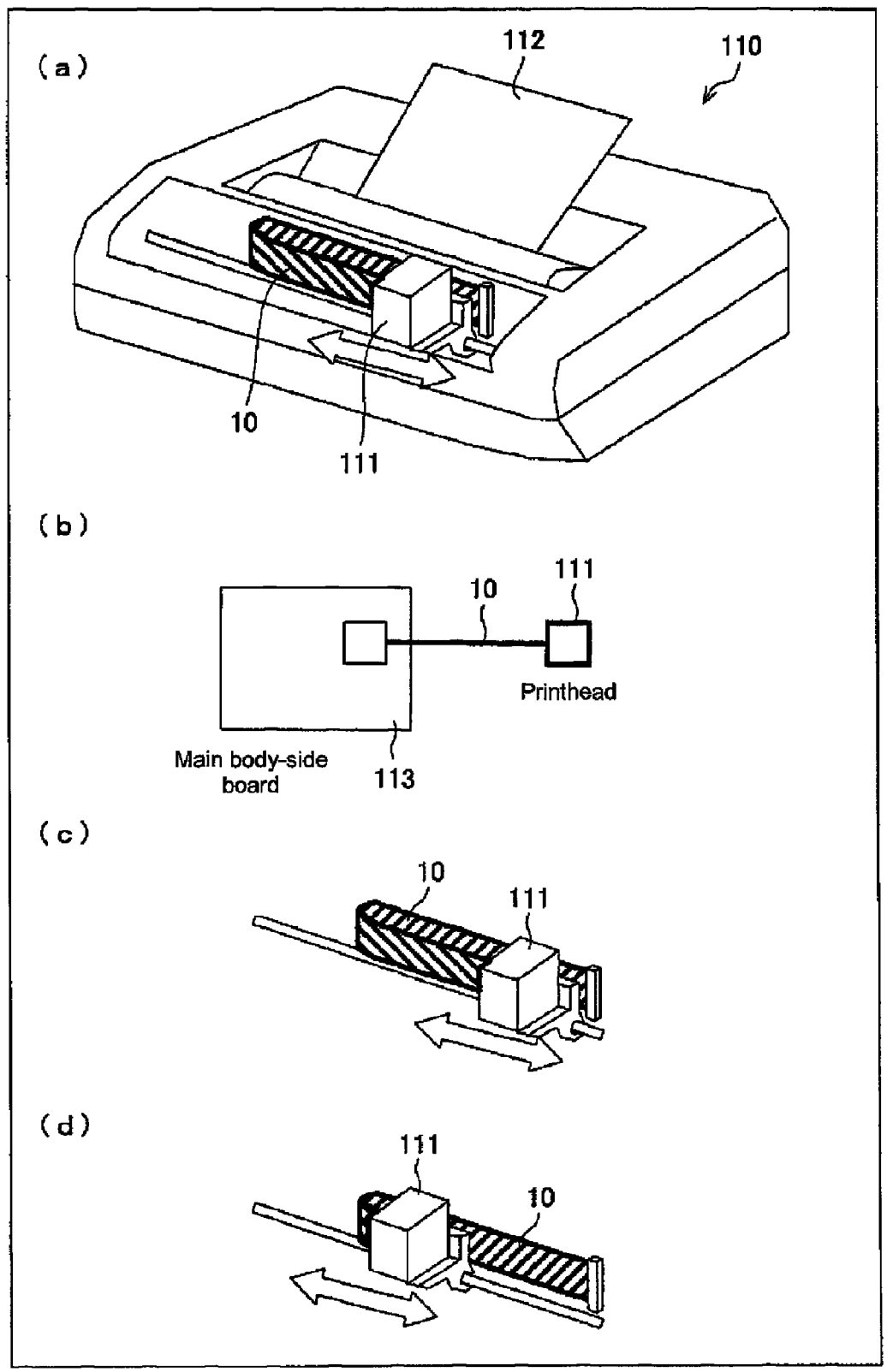
FIG. 13(a) is a perspective view showing an appearance of a printer provided with the optical transmission module according to the embodiment.
FIG. 13(b) is a block diagram showing a main part of the printer shown in FIG. 13(a), and FIGS. 13(c) and 13(d) are perspective views showing a state in which the optical transmission line is bent when a printhead is moved (driven) in the printer.

FIGS. 13(a) to 13(c) show an example in which the optical waveguide 10 is applied to a printer 110. FIG. 13(a) is a perspective view showing an appearance of the printer 110. As shown in FIG. 13(a), the printer 110 includes a printhead 111, and the printhead 111 performs printing to a sheet 112 while being moved in a width direction of the sheet 112. One end of the optical waveguide 10 is connected to the printhead 111.

FIG. 13(b) is a block diagram showing a portion to which the optical waveguide 10 is applied in the printer 110. As shown in FIG. 13(b), one of end portions of the optical waveguide 10 is connected to the printhead 111, and the other end portion is connected to a main body-side board of the printer 110. Control means for controlling an operation of each unit of the printer 110 is provided in the main body-side board.

FIGS. 13(c) and 13(d) are perspective views showing a state in which the optical waveguide 10 is bent when the printhead 111 is moved (driven) in the printer 110. As shown in FIGS. 13(c) and 13(d), in the case where the optical waveguide 10 is applied to the drive unit such as the printhead 111, the bent state of the optical waveguide 10 is changed by the drive of the printhead 111, and the optical waveguide 10 is repeatedly bent at each position.

Accordingly, the optical waveguide 10 of the embodiment is suitable to the drive unit. Further, the high-speed and large-capacity communication in which the drive unit is used can be realized by applying the optical waveguide 10 to the drive unit.

Figure 14:
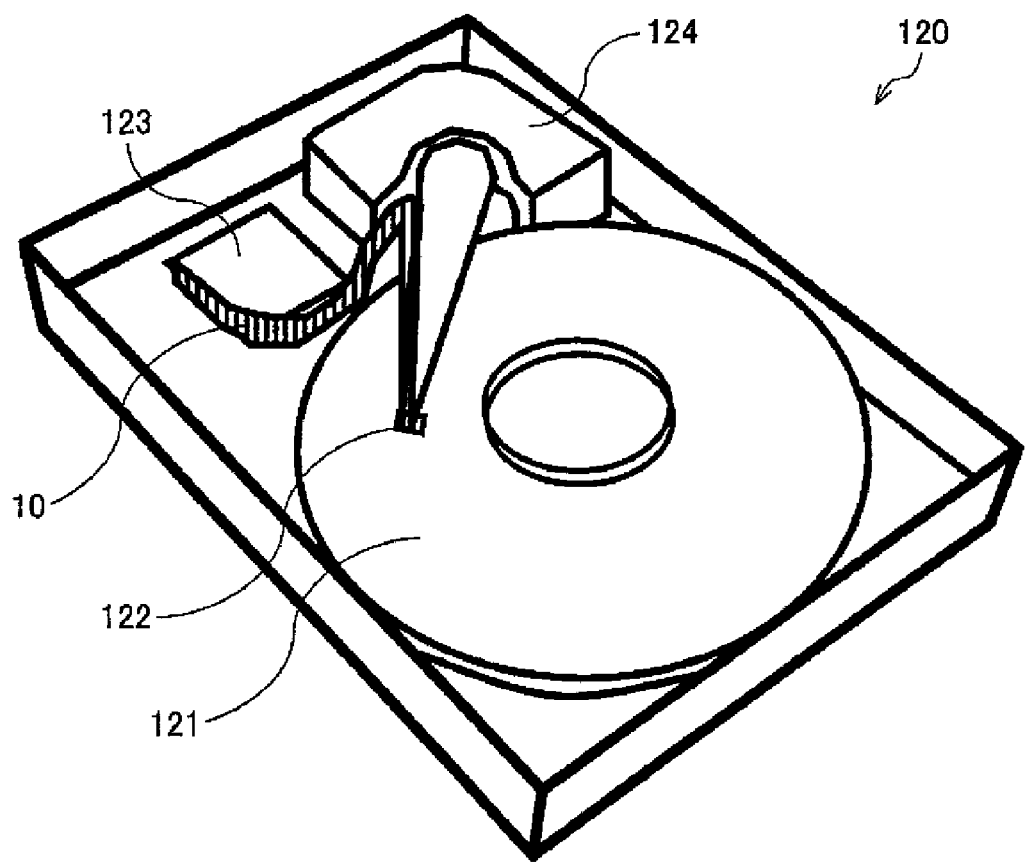
FIG. 14 is a perspective view showing an appearance of a hard disk recording and reproducing apparatus provided with the optical transmission module according to the embodiment.

FIG. 14 shows an example in which the optical waveguide 10 is applied to a hard disk recording and reproducing apparatus 120.

As shown in FIG. 14, the hard disk recording and reproducing apparatus 120 includes a disk (hard disk) 121, a head (reading and writing head) 122, a board introduction unit 123, a drive unit (drive motor) 124, and the optical waveguide 10.

The drive unit 124 drives the head 122 along a radial direction of the disk 121. The head 122 reads information recorded on the disk 121, and writes the information on the disk 121. The head 122 is connected to the board introduction unit 123 through the optical waveguide 10. The head 122 transmits the information read from the disk 121 to the board introduction unit 123 in the form of the optical signal. The head 122 receives the optical signal of the information written on the disk 121, and the information written on the disk 121 is transmitted from the board introduction unit 123.

Thus, the high-speed and large-capacity communication can be realized by applying the optical waveguide 10 to the drive unit such as the head 122 of the hard disk recording and reproducing apparatus 120.

Thus, the optical module according to one or more embodiments of the present invention includes the optical element which transmits or receives the optical signal; the optical transmission line which is optically coupled to the optical element to transmit the optical signal; and the board to which at least one end portion including the incident and outgoing port of the optical signal in the optical transmission line and the optical element are fixed, wherein the space is provided between the board and the optical transmission line, the optical transmission line being movable in at least the direction perpendicular to the optical axis of the optical element in the space, and the space is filled with the bonding agent.

In the optical module, because the optical transmission line has high flexibility, the deformation is easily generated in the optical transmission line by the tensile force when the tensile force is generated in the optical axis direction of the optical transmission line. On the other hand, the board to which the optical transmission line is bonded has high rigidity, and the deformation is hardly generated in the board. Therefore, the large shearing force acts on the interface between the optical transmission line and the board.

According to the configuration, the space is provided between the board and the optical transmission line, and the space is filled with the bonding agent. Therefore, in the bonding agent, the difference in deformation amount between the optical transmission line and the board can be absorbed by the deformation of the bonding agent, so that the peel-off of the optical transmission line and the breakage of the optical transmission line are hardly generated, and the optical transmission line and the board are stably bonded to each other.

In the optical module, preferably the space is not lower than 50 µm. According to the configuration, the bonding agent can have the thickness enough to absorb the difference in deformation amount between the optical transmission line and the board.

In the optical module, preferably one of the ultraviolet curing resin, the visible-light curing resin, and the thermoset resin is used as the bonding agent. Particularly, when one of the ultraviolet curing resin and the visible-light curing resin is used as the bonding agent, the optical coupling can stably be realized to improve the productivity of the optical module in a process of mounting the optical transmission line on the board in the configuration.

In the optical module, preferably the bonding agent is a resin having an elastic modulus lower than that of the board. According to the configuration, the optical transmission line and the board are bonded more stably, because the difference in deformation amount between the optical transmission line and the board is easily absorbed by the deformation of the bonding agent.

In the optical module, the optical transmission line has the structure in the portion where the optical transmission line is fixed to the board, the optical transmission line being able to be retained against the stress in the optical axis direction of the optical transmission line in the structure.

For example, in the structure in which the optical transmission line can be retained, a projection is formed toward the optical transmission line in the portion of the board to which the optical transmission line is fixed, the portion of the board to which the optical transmission line is fixed is tapered in the optical axis direction of the optical transmission line, or the portion of the optical transmission line to which the board is fixed is tapered in the optical axis direction of the optical transmission line.

According to the configuration, because the optical transmission line is retained against the tensile force in the optical axis direction thereof, the peel-off of the optical transmission line is hardly generated, and the optical transmission line and the board are stably bonded to each other.

In the optical module, the bonding agent can have the fillet shape.

According to the configuration, the fillet is formed to increase the bonding strength in the bonding layer on the side opposite to the bonding side on which the optical transmission line and the optical element are bonded. The side opposite to the bonding side becomes easily the start point of the peel-off of the optical transmission line. Therefore, the peel-off of the optical transmission line is hardly generated, and the optical transmission line and the board are stably bonded to each other.

In the optical module, the contact area between the optical transmission line and the bonding agent is large. According to the configuration, because the bonding strength is increased by enlarging the contact area between the optical transmission line and the bonding agent, the peel-off of the optical transmission line is hardly generated, and the optical transmission line and the board are stably bonded to each other.

Examples of the specific structure in which the contact area between the optical transmission line and the bonding agent is enlarged include a structure (see FIG. 8) in which the fillet is formed in the bonding agent at the boundary between the board and the optical transmission line and a structure (see FIG. 9) in which an edge opposite to the bonding side between the optical transmission line and the optical element is formed while extended in the board.

In the optical module, the optical transmission line can have a reinforcing material in at least a surface in the width direction of the optical transmission line, the reinforcing material having the small stretching property.

According to the configuration, even if the tensile force is generated in the optical axis direction of the optical transmission line, the deformation is hardly generated in the optical transmission line, because the reinforcing material obstructs the deformation of the optical transmission line. Therefore, the peel-off of the optical transmission line is hardly generated, and the optical transmission line and the board are stably bonded to each other.

The present invention is not limited to the above-described embodiments, but various modifications can be made without departing from the scope of the invention. That is, the technical scope of the present invention includes an embodiment obtained by a combination of technical means which are appropriately changed without departing from the scope of the invention.

The invention claimed is:
1. An optical module comprising:
an optical element which transmits or receives an optical signal;
an optical transmission line optically coupled to the optical element to transmit the optical signal; and
a board to which at least one end portion including an incident and outgoing port of the optical signal in the optical transmission line and the optical element are fixed, wherein
a wall facing a side surface of the optical transmission line is provided in the board, a first space is provided between the board and the optical transmission line, and a second space is provided between the side surface of the optical transmission line and the wall, and the first and second spaces are filled with a bonding agent, wherein, in the boding agent, a difference in deformation amount between the optical transmission line and the board is absorbed by a deformation of the bonding agent, so that a peel-off and a breakage of the optical transmission line are hardly generated, and the optical transmission line and the board are stably bonded to each other.

2. The optical module according to claim 1, wherein the first space is at least 50 μm.

3. The optical module according to claim 1, wherein the bonding agent is an ultraviolet curing resin.

4. The optical module according to claim 1, wherein the bonding agent is a visible-light curing resin.

5. The optical module according to claim 1, wherein the bonding agent is a thermoset resin.

6. The optical module according to claim 1, wherein the bonding agent is a resin having an elastic modulus lower than the board.

7. The optical module according to claim 1, wherein the optical transmission line is a polymer waveguide.

8. The optical module according to claim 7, wherein the polymer waveguide has flexibility.

9. The optical module according to claim 1, wherein the optical transmission line has a structure in a portion in which the optical transmission line is fixed to the board, and the optical transmission line is retained against a stress in an optical axis direction of the optical transmission line in the structure.

10. The optical module according to claim 9, wherein, in the structure in which the optical transmission line is retained, a projection is formed toward the optical transmission line in a portion of the board to which the optical transmission line is fixed.

11. The optical module according to claim 9, wherein, in the structure in which the optical transmission line is retained, a portion of the board to which the optical transmission line is fixed is tapered in an optical axis direction of the optical transmission line.

12. The optical module according to claim 9, wherein, in the structure in which the optical transmission line is retained, a portion of the optical transmission line to which the board is fixed is tapered in an optical axis direction of the optical transmission line.

13. The optical module according to claim 1, wherein the bonding agent has a fillet shape in a boundary portion between the board and the optical transmission line.

14. The optical module according to claim 1, wherein a contact area between the optical transmission line and the bonding agent.

15. The optical module according to claim 1, wherein the optical transmission line has a reinforcing material in at least a surface in a width direction of the optical transmission line, the reinforcing material having a small stretching property.

16. An optical transmission module comprising:
the optical module according to claim 1 which includes an optical element in one of two end portions of an optical transmission line, the optical element having a light-emitting function; and
the optical module according to claim 1 which includes an optical element in the other end portion, the optical element having a light acceptance function.

17. An electronic device comprising the optical transmission module according to claim 16.

* * * * *